United States Patent
Yi et al.

(10) Patent No.: US 7,386,944 B2
(45) Date of Patent: Jun. 17, 2008

(54) METHOD AND APPARATUS FOR DRYING A WAFER, AND AN APPARATUS FOR CLEANING AND DRYING A WAFER

(75) Inventors: Hun-Jung Yi, Suwon-si (KR); Won-Young Chung, Hwasung-si (KR); Sang-Oh Park, Yongin-si (KR); Ye-Ro Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/983,023

(22) Filed: Nov. 5, 2004

(65) Prior Publication Data

US 2005/0097771 A1 May 12, 2005

(30) Foreign Application Priority Data

Nov. 8, 2003 (KR) ............... 10-2003-0078841

(51) Int. Cl.
*F26B 21/06* (2006.01)
*F26B 21/12* (2006.01)
*B08B 3/00* (2006.01)

(52) U.S. Cl. .................. 34/527; 34/541; 34/230; 134/95.2; 134/102.2; 134/102.3; 134/105; 134/902

(58) Field of Classification Search ........... 34/443, 34/487, 492, 516, 519, 72, 209, 210, 215, 34/216, 223, 224, 230, 526, 527, 535, 541; 134/61, 95.2, 105, 902, 102.2, 102.3
See application file for complete search history.

(56) References Cited

U.S. PATENT DOCUMENTS

| | | | | |
|---|---|---|---|---|
| 5,896,875 A | * | 4/1999 | Yoneda | 134/102.3 |
| 6,164,297 A | * | 12/2000 | Kamikawa | 134/61 |
| 6,401,732 B2 | | 6/2002 | Bergman | 134/61 |
| 6,642,155 B1 | * | 11/2003 | Whitman et al. | 438/758 |

FOREIGN PATENT DOCUMENTS

| | | | |
|---|---|---|---|
| EP | 1170564 A1 | * | 1/2002 |
| JP | 10000393 A | * | 1/1998 |
| JP | 00-223466 | | 8/2000 |
| KR | 97-05262 | | 7/1997 |

* cited by examiner

Primary Examiner—Jiping Lu
(74) Attorney, Agent, or Firm—F. Chau & Assoc., LLC

(57) ABSTRACT

A method an apparatus for drying a wafer, and an apparatus for cleaning and drying a wafer are provided. In the apparatus for cleaning and drying a wafer, the wafer is dipped into a cleaning solution in a cleaning tank. The wafer is then dried using a drying gas in a drying chamber disposed over the cleaning tank. A shutter separates the cleaning tank from the drying tank. A wafer boat moves the wafer vertically between the cleaning tank and the drying tank. Nozzles for providing the cleaning solution onto the wafer are disposed at both inner sides of the drying tank. The nozzles are connected to a drying gas supply unit to alternately and periodically provide the drying gas onto the wafer.

19 Claims, 6 Drawing Sheets

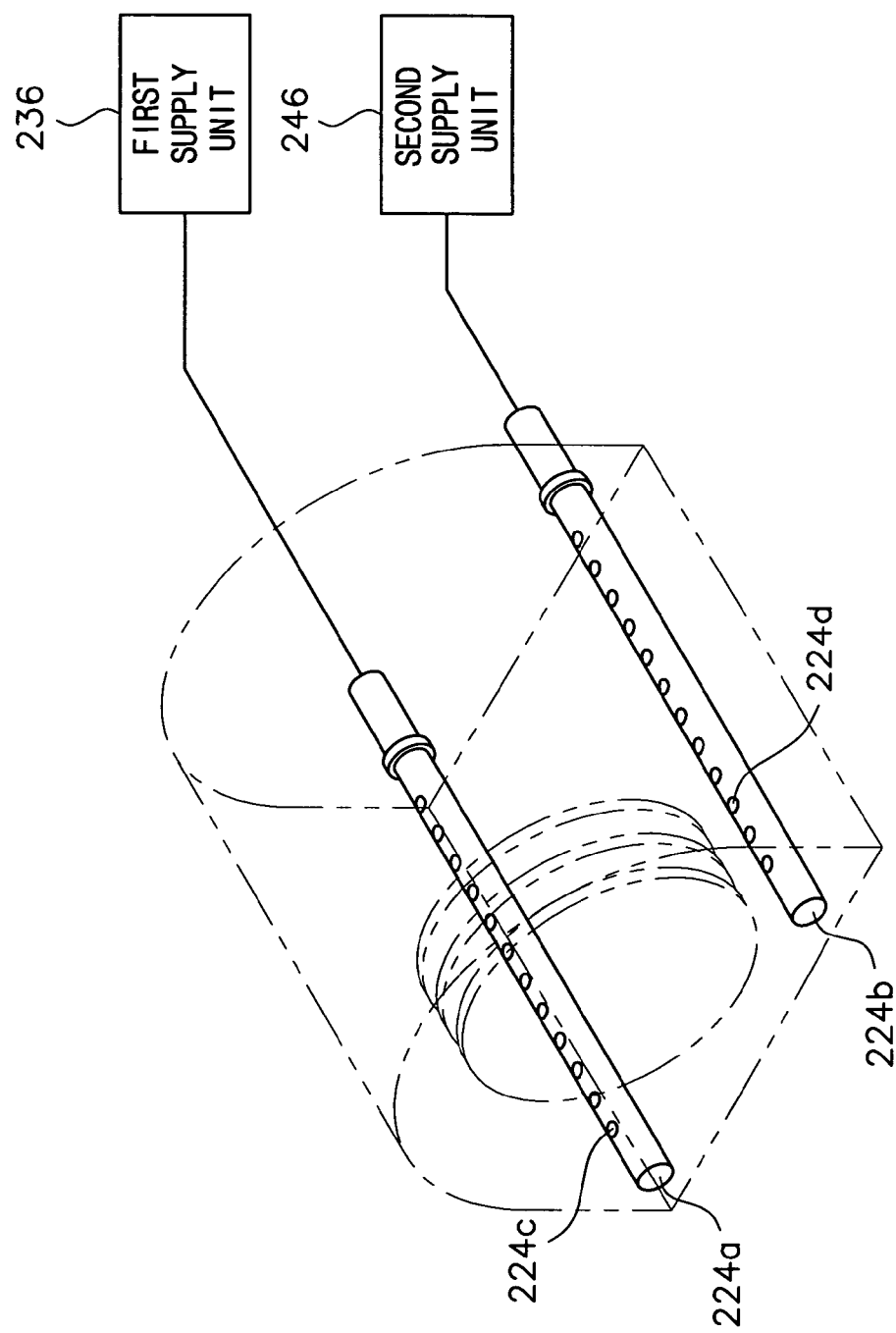

METHOD AND APPARATUS FOR DRYING A WAFER, AND AN APPARATUS FOR CLEANING AND DRYING A WAFER

CROSS REFERENCE TO RELATED APPLICATION

This application claims priority under 35 USC § 119 to Korean Patent Application No. 2003-78841, filed on Nov. 8, 2003, the content of which is herein incorporated by reference in its entirety.

BACKGROUND OF THE INVENTION

1. Field of the Invention

The present invention relates to a method and apparatus for drying a wafer and an apparatus for cleaning and drying a wafer. More particularly, the present invention relates to a method and apparatus for drying a wafer using an isopropyl alcohol vapor and an apparatus for cleaning using a cleaning solution and then drying the cleaned wafer using an isopropyl alcohol gas.

2. Description of the Related Art

Generally, a semiconductor device is manufactured by a fabrication process for forming an electrical circuit on a silicon substrate that is used for a semiconductor substrate, an electrical die sorting (EDS) process for testing electrical characteristics of the electric circuit, and a packaging process for enclosing the substrate with an epoxy resin and then separating the substrate into single chips.

The fabrication process includes a deposition process for forming a layer on a wafer, a chemical mechanical polishing process for planarizing a surface of the layer, a photolithography process for forming a photoresist pattern on the layer, an etching process for forming a pattern having electrical characteristics using the photoresist pattern as an etching mask, an implantation process for implanting ions into predetermined regions of the wafer, a cleaning process for removing particles from a surface of the wafer, a drying process for drying the wafer after the cleaning process, and a testing process for detecting defects of the layer or the pattern.

In the cleaning process, the wafer is dipped into a cleaning solution or a rinsing solution to remove particles from the surface of the wafer. An apparatus for cleaning a wafer, capable of carrying out the above-described cleaning process, is provided with an apparatus for drying a wafer. The apparatus for drying a wafer removes moisture from the wafer using the Marangoni effect. In particular, a drying gas including a volatile organic solution gas, such as an isopropyl alcohol gas, is provided to the rinsing solution remaining on the surface of the wafer to remove the moisture from the wafer.

An apparatus for cleaning and drying a wafer is disclosed in U.S. Pat. No. 6,068,002 issued to Kamikawa, the apparatus of which includes a cleaning tank for storing a cleaning solution or a rinsing solution, a drying tank disposed over the cleaning tank, a shutter disposed between the cleaning tank and drying tank, and a wafer boat for transferring the wafer between the cleaning tank and drying tank.

The wafer boat supports a plurality of wafers. The wafers are inserted into slots of the wafer boat in a vertical direction. A pair of nozzles is disposed on both inner sides of the drying chamber. The nozzles spray the drying gas including an isopropyl alcohol gas on an upper portion of the wafer. The isopropyl alcohol gas removes the moisture from the wafer.

FIG. 1 is a schematic cross-sectional view illustrating a conventional apparatus 100 for drying a wafer or wafers. Referring to FIG. 1, the conventional apparatus 100 for drying a wafer includes a drying tank 110, a drying gas supply unit 120, a pair of nozzles 136 and a wafer boat 140.

The drying tank 110 defining a drying chamber 110a is disposed over a cleaning tank (not shown). A shutter 150, which moves horizontally, is disposed between the cleaning tank and the drying tank 110. The shutter 150 operates to separate the cleaning tank and the drying tank 110 from each other. The drying tank 110 includes a fixed base 112 and a top cover 114. The fixed base 112 is disposed on the cleaning tank. The top cover 114 having an arch-shaped section moves in a direction substantially perpendicular to the fixed base 112. Sealing members 160 are interposed between the fixed base 112 and the top cover 114 and between the fixed base 112 and shutter 150, respectively.

The wafer boat 140 in which a plurality of wafers W, for example 50 wafers, is received in a line, is disposed in the drying tank 110. The wafer boat 140 transfers the wafers W between the cleaning tank and the drying tank 110. The wafer boat 140 includes a plurality of slots for holding the wafers W. Each wafer is inserted into one of the slots of the wafer boat 140 and is aligned vertically.

The pair of nozzles 136 is disposed in the drying tank 110. In detail, the nozzles 136 are disposed adjacent to both sides of the fixed base 112. The nozzles 136 provide a drying gas into the drying tank 110.

The nozzles 136 are connected to the drying gas supply unit 120. The nozzles 136 spray the drying gas relatively toward an upper portion of the aligned wafers. After the nozzles 136 spray the drying gas upwardly, the drying gas flows upwardly from the nozzles 136 along the inner sidewall of the top cover 114. The drying gas then flows downwardly through a central portion of a space defined by the top cover 114. The drying gas is then exhausted out of the drying tank 110 through an exhaust port 112a formed through the fixed base 112.

The drying gas includes an isopropyl alcohol gas and a nitrogen gas. The drying gas supply unit 120 includes a first reservoir 122 for storing the nitrogen gas, a second reservoir 124 for storing the liquefied isopropyl alcohol, a first heater 126 for pre-heating the nitrogen gas, a pump 128 for pumping the liquefied isopropyl alcohol, and a second heater 130 for heating the drying gas.

The first heater 126 is connected to the first reservoir 122. The pump 128 is connected to the second reservoir 124. The second heater 130 is connected to the first heater 126 and the pump 128, respectively, through a first diverged pipe 132. The second heater 130 is also connected to the pair of nozzles 136 through a second diverged pipe 134. The nitrogen gas heated by the first heater 126 evaporates the liquefied isopropyl alcohol provided from the pump 128 in the first diverged pipe 132. The second heater 130 heats the drying gas including the isopropyl alcohol gas and the nitrogen gas. The drying gas heated by the second heater 130 is provided into the drying tank 110 through the second diverged pipe 134 and the pair of nozzles 136.

Because an inner pressure of the drying tank 110 and a supply amount of the isopropyl alcohol gas vary periodically in accordance with a moving cycle of the pump 128, drying efficiency of one of the wafers W may decrease. Also, an amount of the drying gas supplied to an upper portion Wt (e.g., wafer top) of one of the wafer Ws is less than that of the drying gas supplied to other portions of the wafer W. In addition, gas flow is unstable due to the drying gas provided from the pair of nozzles 136. As a result, defects such as water-spots are formed on a surface of the wafer W. Particularly, the defects on a central portion of the wafer W are generated more than those on other portions of the wafer W.

SUMMARY OF THE INVENTION

The present invention provides a method and apparatus for drying a wafer that improves drying efficiency by increasing an amount of drying gas and uniformly providing the drying gas to the wafer. The present invention also provides an apparatus for cleaning and drying a wafer having the above-described drying apparatus.

In a method of drying a wafer in accordance with one aspect of the present invention, the wafer is disposed in a drying chamber. A drying gas for drying the wafer is alternately provided onto the wafer from positions adjacent to both sides of the wafer. The drying gas includes an isopropyl alcohol vapor and a nitrogen gas. The drying gas is provided using pumps having different moving cycles.

An apparatus for drying a wafer in accordance with another aspect of the present invention includes a drying tank, a support unit, a pair of nozzles and a pair of pumps. The drying tank defines a drying chamber, and dries a wafer therein. The support unit is disposed in the drying tank, and supports the wafer. The nozzles are disposed at both inner sides of the drying tank, respectively, and spray a drying gas for drying the wafer. The pumps are connected to the nozzles, and alternately provide the drying gas to the drying tank through the nozzles.

An apparatus for drying a wafer in accordance with still another aspect of the present invention includes a drying tank, a support unit and a drying gas supply unit. The drying tank defines a drying chamber, and dries a wafer therein. The support unit is disposed in the drying tank, and supports the wafer. The drying gas supply unit alternately provides a drying gas for drying wafers onto the wafers from positions adjacent to both sides of the wafers supported by the support unit.

The drying gas includes an isopropyl alcohol vapor and a nitrogen gas. The drying gas supply unit includes a first reservoir, a second reservoir, a pair of first heaters, a pair of pumps, a pair of second heaters and a pair of nozzles.

The first reservoir and the second reservoir store the nitrogen gas and liquefied isopropyl alcohol, respectively. The first heaters are connected to the first reservoir, respectively, and heat the nitrogen gas. The pumps are connected to the second reservoir, respectively. The pumps have different moving cycles for alternately pumping a liquefied the isopropyl alcohol. The second heaters are connected to the nozzles, respectively, and heat the drying gas. The nozzles are disposed adjacent to both sides of the wafers supported by the support unit and provide the drying gas into the drying tank.

The second heaters are connected to the first heaters and the pumps through a pair of diverged pipes. The nitrogen gas heated by each first heater evaporates the liquefied isopropyl alcohol in the diverged pipes. The support unit vertically aligns the wafers in the drying tank. The nozzles alternately spray the drying gas toward top portions of the wafers.

An apparatus for drying a wafer in accordance with still another aspect of the present invention includes a drying tank, a support unit, a pair of nozzles and a plurality of pumps. The drying tank defines a drying chamber, and dries the wafer therein. The support unit is disposed in the drying tank, and supports the wafer. The nozzles are disposed at both inner sides of the drying tank, respectively, and spray a drying gas. The pumps connected to the nozzles have different moving cycles for alternately providing the drying gas into the drying tank through the nozzles.

An apparatus for cleaning and drying a wafer in accordance with still another aspect of the present invention includes a cleaning tank, a drying tank, a support unit and a drying gas supply unit. The cleaning tank defining a cleaning chamber has a cleaning solution therein, and also has an opened upper portion. The drying tank defining a dry chamber is disposed over of the cleaning chamber and is in communication with the cleaning chamber. The support unit supports the wafer, and moves the wafer between the cleaning tank and the drying tank. The drying gas supply unit alternately provides a drying gas from positions adjacent to both sides of the wafer while the support unit supports the wafer in the drying chamber.

An apparatus for cleaning and drying in accordance with still another aspect of the present invention includes a cleaning tank, a drying tank, a support unit, a pair of nozzles and a plurality of pumps. The cleaning tank defining a cleaning chamber has a cleaning solution therein, and also has an opened upper portion. The drying tank defining a drying chamber is disposed over the cleaning chamber and is in communication with the cleaning chamber. The support unit supports the wafer, and moves the wafer between the cleaning tank and the drying tank. The nozzles are disposed at both inner sides of the drying tank, respectively. The nozzles spray a drying gas onto the wafer while the wafer is disposed in the drying chamber by the support unit. The pumps are connected to the nozzles. The pumps have different moving cycles for alternately providing the drying gas into the drying tank through the nozzles.

BRIEF DESCRIPTION OF THE DRAWINGS

The above and other features of the present invention will become apparent with reference to the following detailed description when considered in conjunction with the accompanying drawings, wherein:

FIG. 3 is a schematic perspective view illustrating second nozzles shown in FIG. 2;

DESCRIPTION OF THE EXEMPLARY EMBODIMENTS

Figure 2:
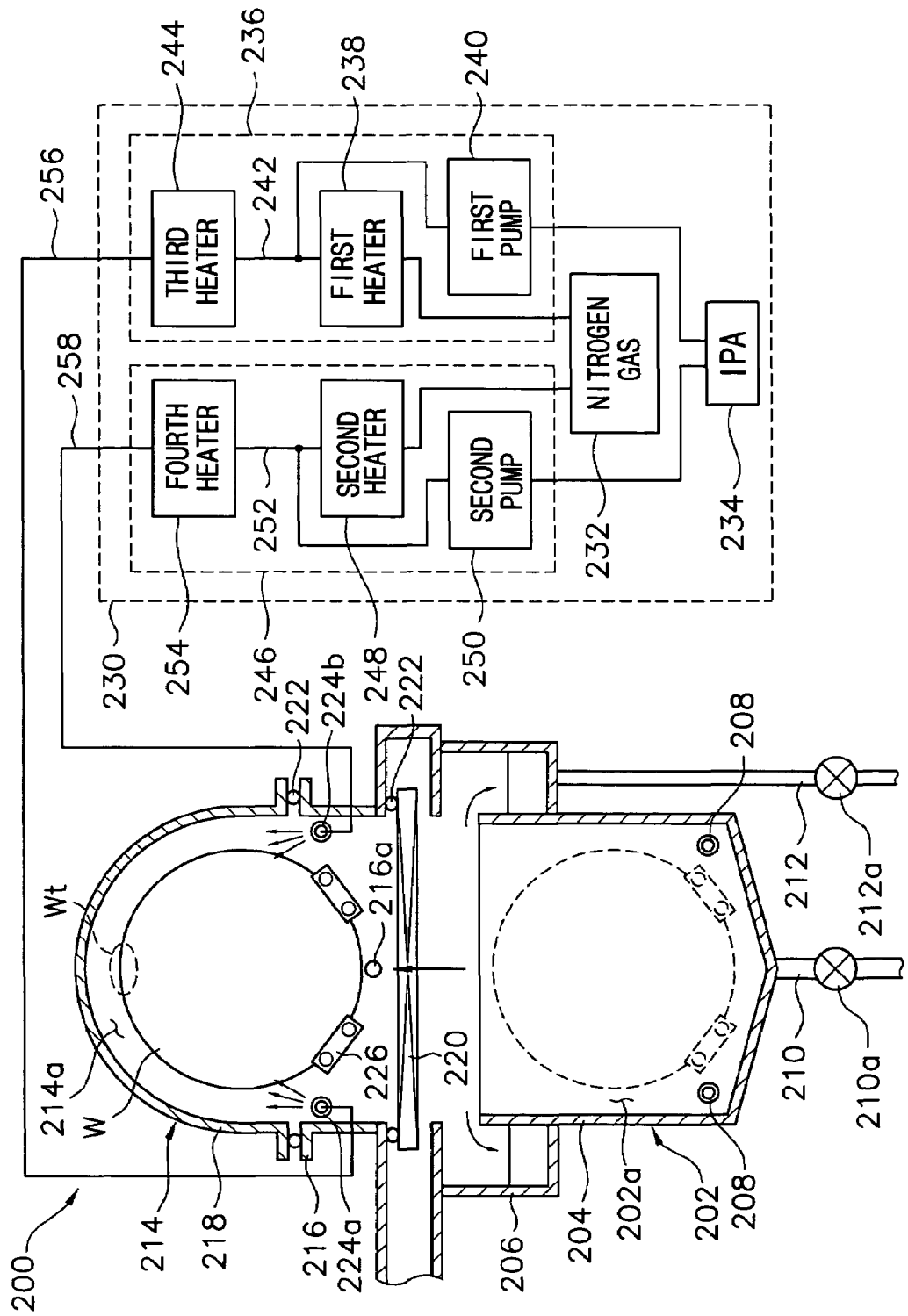
FIG. 2 is a schematic cross-sectional view illustrating an apparatus for cleaning and drying a wafer according to an exemplary embodiment of the present invention.

FIG. 2 is a schematic cross-sectional view illustrating an apparatus for cleaning and drying a wafer according to an exemplary embodiment of the present invention. FIG. 3 is a schematic perspective view showing second nozzles shown in FIG. 2.

Referring to FIGS. 2 and 3, an apparatus 200 for cleaning and drying a wafer or wafers W includes a cleaning tank 202, a drying tank 214, a wafer boat 226 and a drying gas supply unit 230. The cleaning tank 202 stores a cleaning solution used for removing particles from a surface of the wafer W. Moisture is removed from the wafer W when it is in the drying tank 214. The wafer boat 226 supports a plurality of wafers W. The drying gas supply unit 230 provides a drying gas to the wafers W to dry the wafers W.

The cleaning tank 202 defines a cleaning chamber 202a for cleaning the wafers W supported by the wafer boat 226. The cleaning tank 202 includes an inner bath 204 and an outer bath 206. The inner bath 204 contains the cleaning solution. The outer bath 206 is disposed around an upper portion of the inner bath to receive the cleaning solution flowing over the inner bath 204.

The cleaning tank 202 has an opening formed at an upper portion of the cleaning tank 202. First nozzles 208 are disposed at both inner sides of the inner bath 204 for providing the cleaning solution onto the wafers W disposed in the inner bath 204. A first draining pipe 210 having a first draining valve 210a is connected to a lower portion of the inner bath 204 to exhaust the cleaning solution in the inner bath 204. A second draining pipe 212 having a second draining valve 212a is connected to a lower portion of the outer bath 206 to exhaust the cleaning solution in the outer bath 206.

The drying tank 214 defining a drying chamber 214a is disposed over the cleaning tank 202. The drying tank 214 includes a fixed base 216 disposed over the cleaning tank 202 and a top cover 218 disposed on the fixed base 216. The fixed base 216 is in communication with the opening of the cleaning tank 202. Sealing members 222 are interposed between the fixed base 216 and the top cover 218 and between the fixed base 216 and a shutter 220, respectively. The top cover 218 is disposed such that the top cover 218 is movable substantially perpendicular to the fixed base 216. The top cover 218 has an arch-shaped section.

A pair of second nozzles 224a and 224b is disposed at both inner sides of the drying tank 214 to spray the drying gas. In particular, the pair of second nozzles 224a and 224b is extended horizontally along both inner sidewalls of the fixed base 216. The pair of second nozzles 224a and 224b has a tubular shape. The pair of second nozzles 224a and 224b has a plurality of openings 224c and 224d (as shown in FIG. 3) for spraying the drying gas. An exhaust port 216a connected to an exhaust pipe (not shown) for exhausting the drying gas from the drying tank 214 is formed at the fixed base 216.

The shutter 220 is disposed between the cleaning tank 202 and the drying tank 214. The shutter 220 is horizontally movable. An inner sidewall of the drying tank 214 and an upper face of the shutter 220 define the drying chamber 214a.

The wafer boat 226 supports the plurality of the wafers W, for example 50 wafers, in a line. The wafers W are inserted into slots of the wafer boat 226, and aligned vertically. The wafers W are transported to the wafer boat 226 using a wafer-transferring robot. The wafer boat 226 moves vertically between the cleaning tank 202 and the drying tank 214. For cleaning the wafers W, the wafer boat 226 moves the wafers W downwardly so that the wafers W are dipped into the cleaning solution in the inner bath 204. For drying the wafers W, the wafer boat 226 moves upwardly. Additionally, a nitrogen gas may be provided onto the wafers W to prevent a native oxide growth on a surface portion of the wafers W.

The cleaning solution includes a hydrofluoric acid solution or pure water. The hydrofluoric acid solution removes particles from the surface of the wafer W, or a native oxide on the surface of the wafer W. The pure water rinses the wafer W cleaned using chemical solutions such as the hydrofluoric acid solution. Alternatively, suitable materials may be used in the cleaning solution according to a type of particle remaining on the surface of the wafer W.

The above-described elements are disclosed in U.S. Pat. No. 6,068,002 issued to Kamikawa, which discloses an apparatus including the above-described elements. Thus, further illustrations of the above-described elements are omitted.

The drying gas supply unit 230 is connected to the pair of the second nozzles 224a and 224b. The drying gas includes an isopropyl alcohol gas and a nitrogen gas. The drying gas supply unit 230 includes a first reservoir 232 for storing the nitrogen gas, a second reservoir 234 for storing the liquefied isopropyl alcohol, first and second heaters 238 and 248 for heating the nitrogen gas provided from the first reservoir 232, first and second pumps 240 and 250 for alternately providing the liquefied isopropyl alcohol, and third and fourth heaters 244 and 254 for heating the drying gas.

The first and second heaters 238 and 248 are connected to the first reservoir 232, and the first and second pumps 240 and 250 are connected to the second reservoir 234. The third heater 244 is connected to the first heater 238 and the first pump 240 through a first diverged pipe 242. The fourth heater 254 is connected to the second heater 248 and the second pump 250 through a second diverged pipe 252. The third and fourth heaters 244 and 254 are connected to the pair of second nozzles 244a and 244b through a first supplying pipe 256 and a second supplying pipe 258, respectively.

Referring to FIG. 2, the drying gas supply unit 230 includes a first supplying member 236 connected to the second nozzle 224a disposed on a left side of the fixed base 216, a second supplying member 246 connected to the second nozzle 224b disposed on a right side of the fixed base 216, the first reservoir 232 and the second reservoir 234. The first supplying member 236 includes the first heater 238 connected to the first reservoir 232, the first pump 240 connected to the second reservoir 234, the third heater 244 connected to the first heater 238 and the first pump 240 through the first diverged pipe 242.

The first pump 240 provides the liquefied isopropyl alcohol into the first diverged pipe 242. The nitrogen gas heated by the first heater 238 evaporates the liquefied isopropyl alcohol in the first diverged pipe 242. The third heater 244 heats a first drying gas that includes the isopropyl alcohol gas and the nitrogen gas. The first drying gas heated by the third heater 244 is provided into the drying tank 214 through the second nozzle 224a disposed on the left side of the fixed base 216.

The second supplying member 246 includes the second heater 248 connected to the first reservoir 232, the second pump 250 connected to the second reservoir 234, the fourth heater 254 connected to the second heater 248 and the second pump 250 through the second diverged pipe 252.

The second pump 250 provides the liquefied isopropyl alcohol into the second diverged pipe 252. The nitrogen gas heated by the second heater 248 evaporates the liquefied isopropyl alcohol in the second diverged pipe 252. The fourth heater 254 heats a second drying gas that includes the isopropyl alcohol gas and the nitrogen gas. The second drying gas heated by the fourth heater 254 is provided into the drying tank 214 through the first nozzle 224b disposed on the right side of the fixed base 216.

The first pump 240 of the first supplying member 236 and the second pump 250 of the second supplying member 246 have different moving cycles to alternately and periodically provide the first drying gas and the second drying gas, respectively. When an amount of the first drying gas provided from the first pump 240 reaches a maximum, an amount of the second drying gas provided from the second pump 250 reaches a minimum, and vice versa.

Figure 4A:
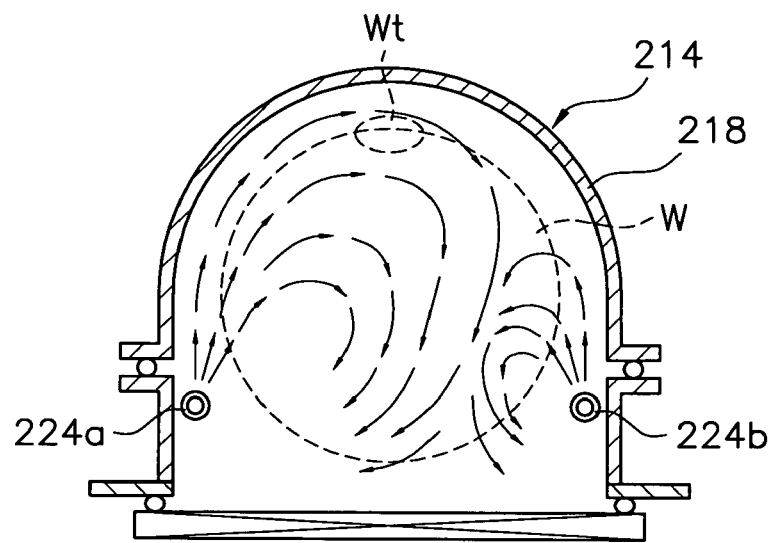
FIG. 4A is a cross-sectional view illustrating flows of a first drying gas in a drying reservoir.
Figure 4B:
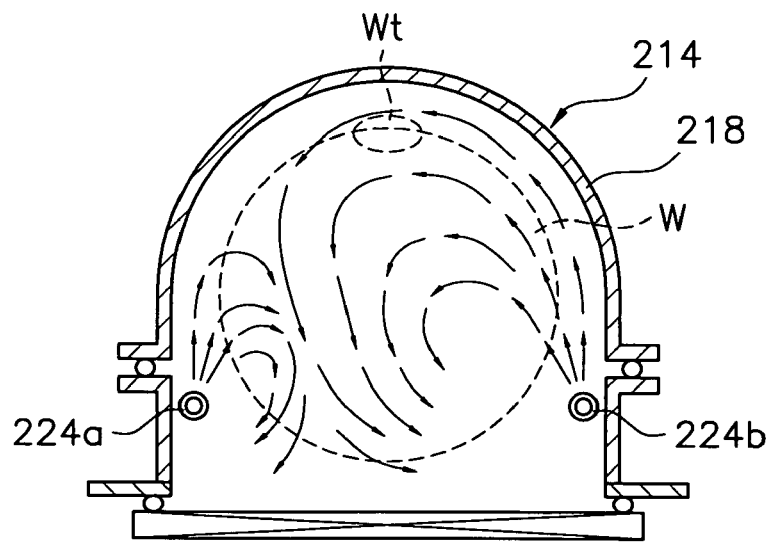
FIG. 4B is a cross-sectional view illustrating flows of a second drying gas in a drying reservoir.

FIG. 4A is a cross-sectional view illustrating flows of a first drying gas in a drying reservoir. FIG. 4B is a cross-sectional view illustrating flows of a second drying gas in a drying reservoir.

Referring to FIG. 4A, when the amount of the first drying gas supplied is greater than that of the second drying gas, the wafers W are dried mainly by the first drying gas. The first drying gas is sprayed upwardly from the second nozzle 224a disposed on the left side of the fixed base 216. The first drying gas circulates in a clockwise direction along the inner sidewall of the top cover 218 passing over the top portions Wt of the wafers W.

Referring to FIG. 4B, when the amount of the second drying gas supplied is greater than that of the first drying gas, the wafers W are dried mainly by the second drying gas. The second drying gas is sprayed upwardly from the first nozzle 224b disposed on the right side of the fixed base 216. The second drying gas circulates in a counterclockwise direction along the inner sidewall of the top cover 218 passing over the top portions Wt of the wafers W.

Figure 1:
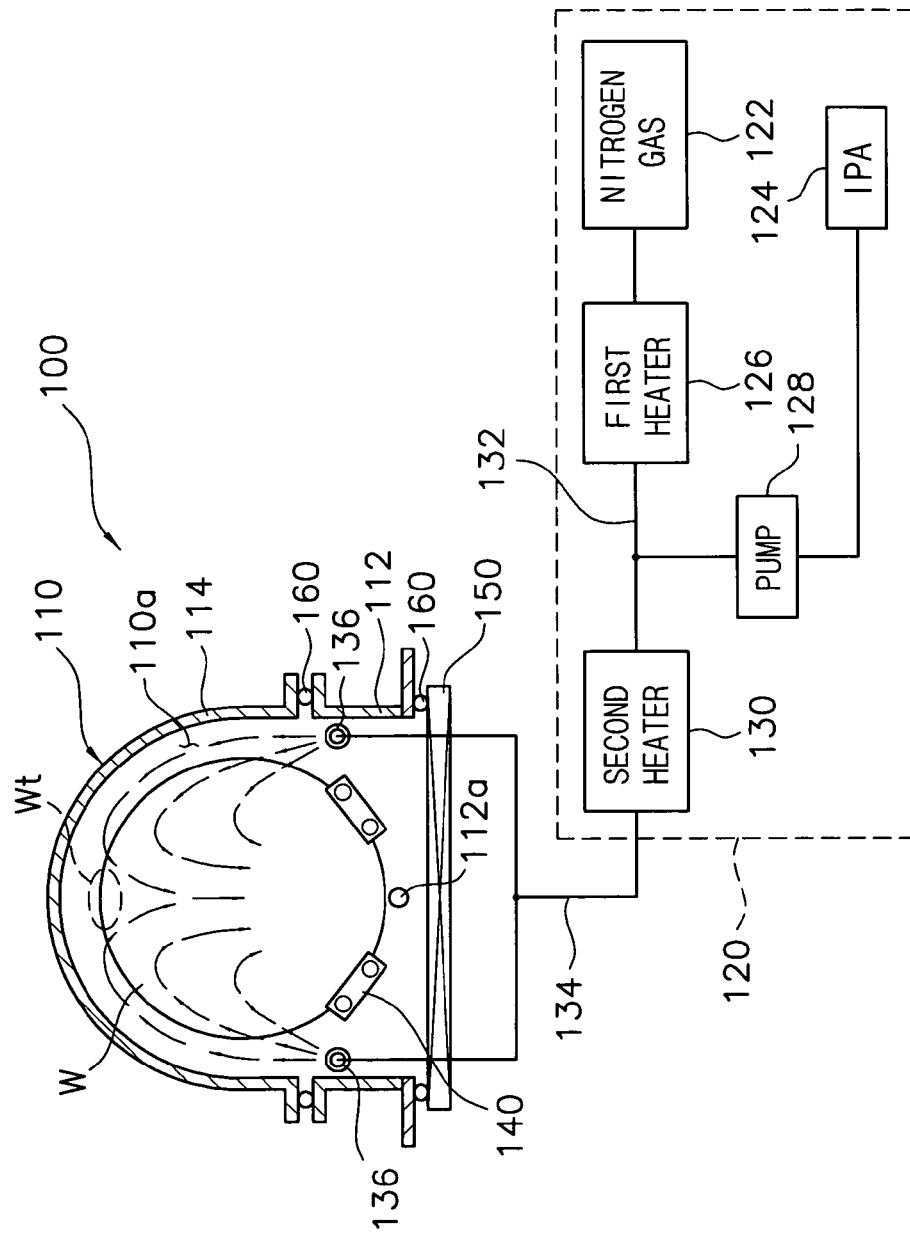
FIG. 1 is a schematic cross-sectional view illustrating a conventional drying apparatus.

The above-described apparatus for drying the wafer W provides more drying gas into the drying chamber 214a as compared to the conventional apparatus 100 for drying the wafer W shown in FIG. 1. Because the first drying gas and the second drying gas are stably and alternately provided to the top portions Wt of the wafers W supported by the wafer boat 226 in the drying tank 214, the efficiency of drying the water W may be improved.

Figure 5:
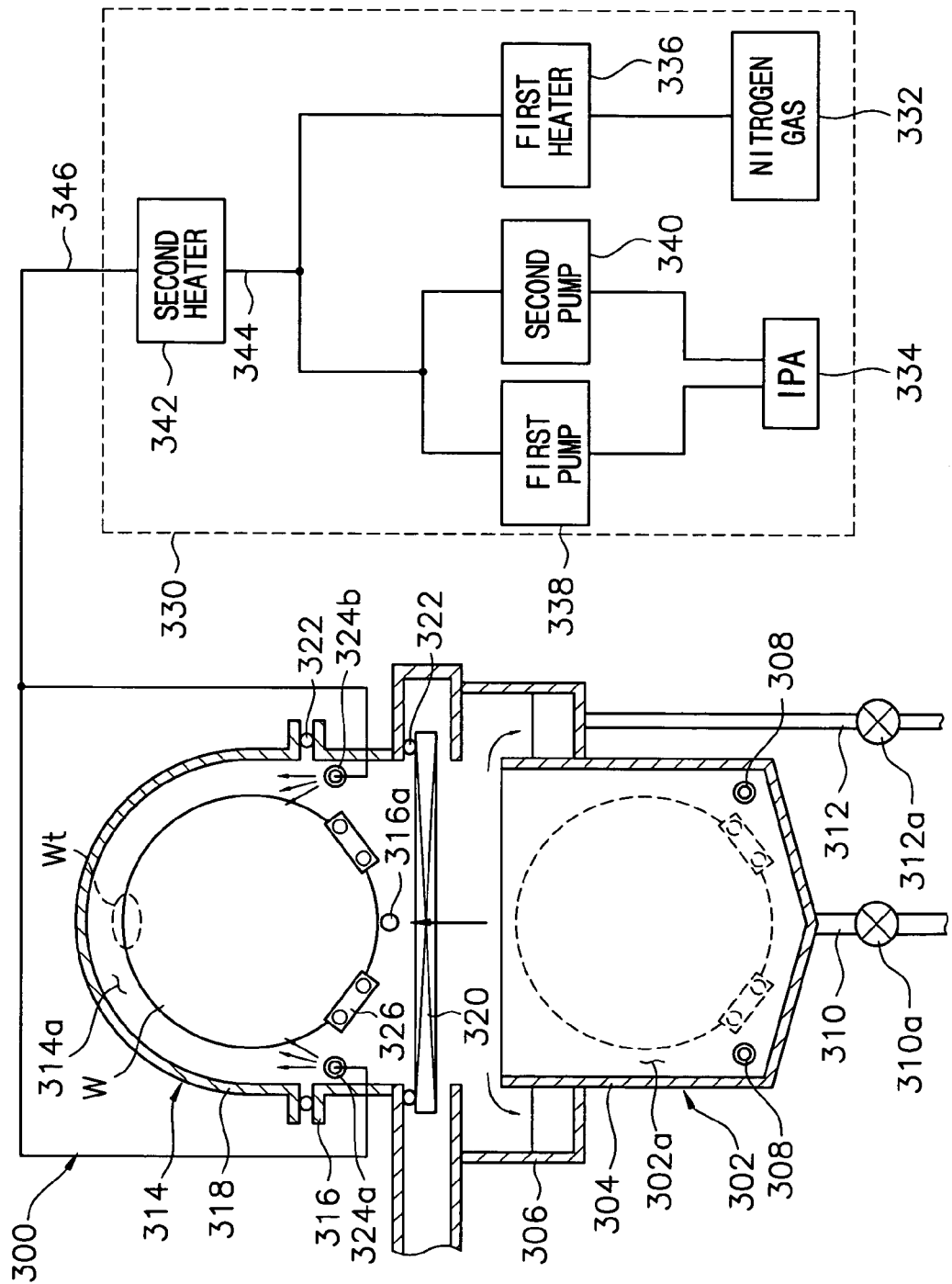
FIG. 5 is a schematic cross-sectional view illustrating an apparatus for cleaning and drying a wafer according to another exemplary embodiment of the present invention.
Figure 6:
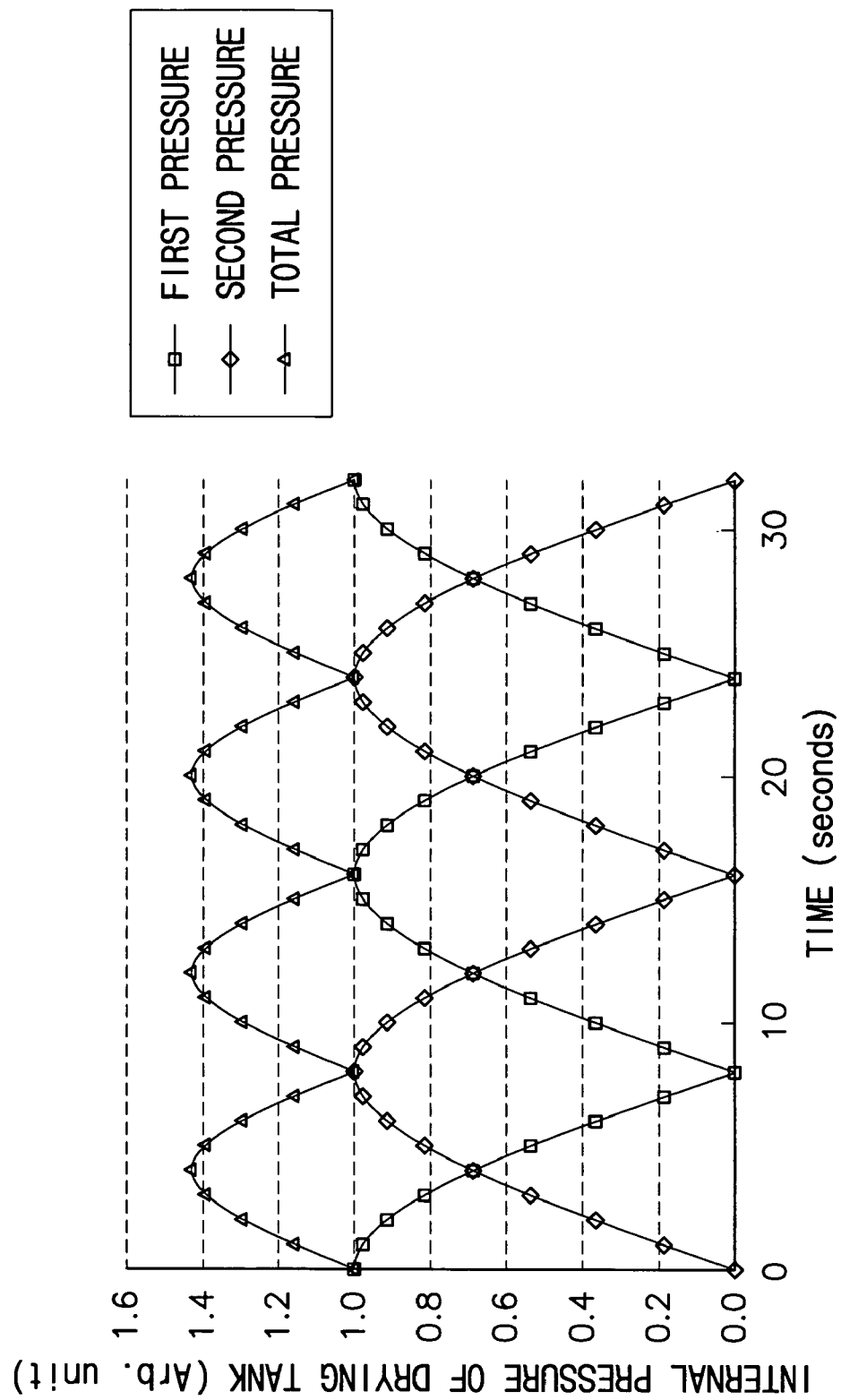
FIG. 6 is a graph showing an internal pressure of a drying tank shown in FIG. 5.

FIG. 5 is a schematic cross-sectional view illustrating an apparatus for cleaning and drying a wafer according to another exemplary embodiment of the present invention. FIG. 6 is a graph showing an internal pressure of a drying tank shown in FIG. 5.

Referring to FIGS. 5 and 6, an apparatus 300 for cleaning and drying a wafer or wafers W includes a cleaning tank 302, a drying tank 314, a shutter 320, a wafer boat 326 and a drying gas supply unit 330.

The wafers W are cleaned using a cleaning solution in the cleaning tank 302. The drying tank 314 is disposed over the cleaning tank 302. After the wafers W are cleaned using the cleaning solution, the wafers W are dried in the drying tank 314. The shutter 320 is movable in a horizontal direction between the cleaning tank 302 and the drying tank 314 to separate the cleaning tank 302 from the drying tank 314. The wafer boat 326 moves the wafers W between the drying tank 314 and the cleaning tank 302. The drying gas supply unit 330 provides a drying gas for drying the wafers W.

The drying tank 314 includes a fixed base 316 and a top cover 318. The fixed base 316 is disposed over the cleaning tank 302. The top cover 318 is disposed on the fixed base 316, and moves vertically. A pair of second nozzles 324a and 324b is disposed at an inner side portion of the fixed base 316. The drying gas for drying the wafers W is provided from the pair of nozzles 324a and 324b.

Reference numerals 302a, 304, 306, 308, 310, 310a, 312, 312a, 314a, 316a, 320 and 322 illustrate a cleaning chamber, an inner bath, an outer bath, first nozzles, a first draining pipe, a first draining valve, a second draining pipe, a second draining valve, a drying chamber, an exhaust port, a shutter and a sealing member, respectively.

The above-described elements of the apparatus 300 for cleaning and drying the wafer W are similar to the elements explained in detail with reference to FIGS. 2 and 3. Therefore, illustrations of the above-described elements are omitted.

The drying gas supply unit 330 is connected to the pair of second nozzles 324a and 324b. The drying gas supply unit 330 includes a first reservoir 332, a second reservoir 334, a first heater 336, first and second pumps 338 and 340 and a second heater 342.

The first reservoir 332 stores a nitrogen gas. The second reservoir 334 stores a liquefied isopropyl alcohol. The first heater 336 is connected to the first reservoir 332, and heats the nitrogen gas. The first and second pumps 338 and 340 are connected to the second reservoir 334, and provide the isopropyl alcohol. The second heater 342 heats the drying gas including the isopropyl alcohol and the nitrogen gas.

The second heater 342 is connected to the first heater 336 and the first and second pumps 338 and 340 through a first diverged pipe 344. The second heater 342 is connected to the pair of second nozzles 324a and 324b through a second diverged pipe 346. The liquefied isopropyl alcohol provided from the first and second pumps 338 and 340 is heated in the first diverged pipe 344 by the nitrogen gas heated by the first heater 336.

The second heater 342 heats the drying gas. The heated drying gas is sprayed from the pair of second nozzles 324a and 324b toward top portions Wt of the wafers W supported by the wafer boat 326 in the drying tank 314. In particular, the pair of second nozzles 324a and 324b spray the drying gas upwardly, and the drying gas flows upwardly from the pair of second nozzles 324a and 324b to upper side portions of the wafers W along an inner sidewall of the top cover 318. Subsequently, the drying gas flows downwardly from the upper side portions of the wafers W to lower side portions of the wafers W through central portions of the wafers W. The drying gas is then exhausted out of the drying tank 314 through an exhaust port 316a formed at the fixed base 316a.

Internal pressure of the drying tank 314 varies with respect to the amount of the drying gas provided from the pair of second nozzles 324a and 324b. The first and second pumps 338 and 340 have different moving cycles to thereby keep the internal pressure of the drying tank 314 above a predetermined pressure. Referring to FIG. 6, a total internal pressure of the drying tank 314 is a summation of a first internal pressure generated by the first pump 338 and a second internal pressure generated by the second pump 340. As a result, the total internal pressure may be kept above the first internal pressure or the second internal pressure. Accordingly, a minimum total internal pressure may be a maximum of the first or second internal pressures. Because the total internal pressure of the drying tank 314 may be kept above the predetermined pressure, the drying efficiency of the wafer W may be improved. According to at least one embodiment of the present invention, the apparatus for cleaning and drying the wafer W has the first and second pumps 338 and 340. Alternatively, the apparatus may have more than two pumps.

According to at least one embodiment of the present invention, first and second pumps alternatively provide a first and second drying gas, respectively. The first and second pumps may also have different moving cycles. Further, alternately providing the first and second drying gases is periodically repeated throughout a process for drying a wafer. Thus, a total internal pressure of a drying tank may be kept above a predetermined pressure. As a result, the drying efficiency of wafers may be improved.

In addition, a first nozzle and a second nozzle alternately and periodically provide the first drying gas and the second drying gas to an upper side portion of the wafer. Thus, the first drying gas and the second drying gas may be stably provided to the upper side portions of the wafers. As a result, the wafers may be uniformly dried.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. An apparatus for drying a wafer comprising:
   a drying tank for disposing the wafer;
   a support unit disposed in the drying tank, the support unit for supporting the wafer;
   a first nozzle disposed at a first inner side of the drying tank and a second nozzle disposed at a second inner side of the drying tank, the first and second nozzles for spraying a drying gas on the wafer; and
   a drying gas supply unit comprising a first supply member, a second supply member, a first reservoir and a second reservoir, the first supply member connected to the first nozzle and the second supply member connected to the second nozzle,
   the first supply member including a first heater connected to the first reservoir, a first pump connected to the second reservoir and a third heater connected to the first heater and the first pump through a first pipe,
   the second supply member including a second heater connected to the first reservoir, a second pump connected to the second reservoir and a fourth heater connected to the second heater and the second pump though a second pipe,
   the first and second pumps having individually controlled moving cycles for alternately and periodically providing respectively different amounts of the drying gas into the drying tank through each of the first and second nozzles, respectively, wherein when the first pump provides a maximum amount of drying gas, the second pump provides a minimum amount of drying gas, and wherein the first pump maximum and the second pump maximum are sequentially and successively repeated with a predetermined frequency, so that a total internal pressure of the drying tank above a predetermined internal pressure of the drying tank is maintained when drying the wafer.

2. The apparatus of claim 1, wherein the drying gas comprises an isopropyl alcohol gas and a nitrogen gas.

3. The apparatus of claim 1, wherein the wafer is vertically supported by the support unit, and wherein the first and second nozzles spray the drying gas on an upper portion of the wafer.

4. The apparatus of claim 1, wherein the first reservoir stores nitrogen gas and the second reservoir stores liquefied isopropyl alcohol.

5. The apparatus of claim 4, wherein the first and second heaters heat the nitrogen gas provided from the first reservoir; and
   the third and fourth heaters heat the drying gas comprising an isopropyl alcohol gas evaporated in the first and second pipes and the nitrogen gas heated by the first and second heaters, respectively.

6. The apparatus of claim 1, wherein the internal pressure of the drying tank is a sum of a first internal pressure generated by the first pump and a second internal pressure generated by the second pump.

7. An apparatus for drying a wafer comprising:
   a drying tank for disposing the wafer;
   a support unit disposed in the drying tank, the support unit for supporting the wafer; and
   a drying gas supply unit comprising a first supply member, a second supply member, a first reservoir and a second reservoir,
   the first supply member including a first heater connected to the first reservoir, a first pump connected to the second reservoir and a third heater connected to the first heater and the first pump through a first pipe,
   the second supply member including a second heater connected to the first reservoir, a second pump connected to the second reservoir and a fourth heater connected to the second heater and the second pump through a second pipe,
   the first and second pumps having individually controlled moving cycles for alternately and periodically providing respectively different amounts of a drying gas onto the wafer from each of a position that is adjacent to a first side of the wafer and a position that is adjacent to a second side of the wafer, respectively, when the wafer is supported by the support unit wherein when the first pump provides a maximum amount of drying gas, the second pump provides a minimum amount of drying gas, and wherein the first pump maximum and the second pump maximum are sequentially and successively repeated with a predetermined frequency, so that a total internal pressure of the drying tank is maintained above a predetermined internal pressure of the drying tank when drying the wafer.

8. The apparatus of claim 7, wherein the drying gas comprises an isopropyl alcohol gas and a nitrogen gas.

9. The apparatus of claim 7, wherein the first reservoir stores nitrogen gas and the second reservoir stores liquefied isopropyl alcohol.

10. The apparatus of claim 9, wherein the first and second heaters heat the nitrogen gas provided from the first reservoir; and
    the third and fourth heaters heat the drying gas comprising an isopropyl alcohol gas evaporated in the first and second pipes and the nitrogen gas heated by the first and second heaters, respectively.

11. The apparatus of claim 9, wherein the liquefied isopropyl alcohol is evaporated in the first and second pipes by the nitrogen gas heated by the first and second heaters, respectively.

12. The apparatus of claim 7, wherein a first nozzle is disposed in the position adjacent to the first side of the wafer and a second nozzle is disposed in the position adjacent to the second side of the wafer, the first and second nozzles for spraying the drying gas into the drying tank.

13. An apparatus for cleaning and drying a wafer comprising:
    a cleaning tank for storing a cleaning solution, the cleaning tank having an open upper portion;
    a drying tank disposed over the cleaning tank and in communication with a cleaning chamber, the drying tank for receiving the wafer;
    a support unit for supporting the wafer, the support unit for moving the wafer between the cleaning tank and the drying tank; and
    a drying gas supply unit comprising a first supply member, a second supply member, a first reservoir and a second reservoir,
    the first supply member including a first heater connected to the first reservoir, a first pump connected to the second reservoir and a third heater connected to the first heater and the first pump through a first pipe, the second supply member including a second heater connected to the first reservoir, a second pump connected to the second reservoir and a fourth heater connected to the second heater and the second pump through a second pipe, the first and second pumps having individually controlled moving cycles for alternately and periodically providing respectively different amounts of a drying gas onto the wafer from each of a position that is adjacent to a first side of the wafer and a position that is adjacent to a second side of the wafer, respectively, when the wafer is supported by the support unit in the drying chamber wherein when the first pump provides a maximum amount of drying gas, the second pump provides a minimum amount of drying gas and when the second pump provides a maximum amount of drying gas, the first puma provides a minimum amount of drying gas, and wherein the first pump maximum and the second pump maximum are sequentially and successively repeated with a predetermined frequency, so that a total internal pressure of the drying tank is maintained above a predetermined internal pressure of the drying tank when drying the wafer.

14. The apparatus of claim 13, wherein the drying gas comprises an isopropyl alcohol gas and a nitrogen gas.

15. The apparatus of claim 13, wherein the cleaning solution is one of a hydrofluoric acid solution and pure water.

16. The apparatus of claim 13, further comprising:
a shutter disposed between the drying tank and the cleaning tank, the shutter being horizontally movable to separate the drying chamber from the cleaning chamber.

17. The apparatus of claim 13, wherein the drying tank includes a top cover that moves substantially perpendicular to the cleaning tank, and wherein the drying tank includes a fixed base disposed under the top cover.

18. The apparatus of claim 13, wherein the cleaning tank includes an inner bath for containing the cleaning solution and an outer bath disposed around the upper portion of the inner bath to receive the cleaning solution flowing over the inner bath, wherein a nozzle for supplying the cleaning solution onto the wafer in the inner bath is disposed in the inner bath, and wherein a first exhaust pipe for exhausting the cleaning solution is connected to a lower portion of the inner bath and a second exhaust pipe for exhausting the cleaning solution is connected to a lower portion of the outer bath.

19. An apparatus for drying a wafer comprising:
a cleaning tank for storing a cleaning solution, the cleaning tank having an open upper portion;
a drying tank for disposing the wafer, the drying tank disposed over the cleaning tank;
a support unit for supporting the wafer, the support unit for moving the wafer between the cleaning tank and the drying tank;
a first nozzle disposed at a first inner side of the drying tank and a second nozzle disposed at a second inner side of the drying tank, the first and second nozzles for spraying a drying gas onto the wafer when the wafer is supported by the support unit in the drying chamber; and
a drying gas supply unit comprising a first supply member, a second supply member, a first reservoir and a second reservoir, the first supply member connected to the first nozzle and the second supply member connected to the second nozzle,
the first supply member including a first heater connected to the first reservoir, a first pump connected to the second reservoir and a third heater connected to the first heater and the first pump through a first pipe,
the second supply member including a second heater connected to the first reservoir, a second pump connected to the second reservoir and a fourth heater connected to the second heater and the second pump through a second pipe,
the first and second pumps having individually controlled moving cycles for alternately and periodically providing respectively maximum and minimum amounts of the drying gas into the drying tank through each of the first and second nozzles, respectively, and wherein the first pump maximum and the second pump maximum are sequentially and successively repeated with a predetermined frequency, so that a total internal pressure of the drying tank is maintained above a predetermined internal pressure of the drying tank when drying the wafer.

* * * * *